(12) United States Patent
Castaldi et al.

(10) Patent No.: US 7,429,400 B2
(45) Date of Patent: Sep. 30, 2008

(54) METHOD OF USING ULTRASONICS TO PLATE SILVER

(76) Inventors: Steve Castaldi, 134 Farmstead La., Torrington, CT (US) 06790; John Swanson, 41 Leavenworth Rd., Woodbury, CT (US) 06798; Witold Paw, 8 Mountain View Rd., New Fairfield, CT (US) 06812

( * ) Notice: Subject to any disclaimer, the term of this patent is extended or adjusted under 35 U.S.C. 154(b) by 415 days.

(21) Appl. No.: 11/300,254

(22) Filed: Dec. 14, 2005

(65) Prior Publication Data
US 2007/0134406 A1    Jun. 14, 2007

(51) Int. Cl.
*B05D 5/12* (2006.01)
*B05D 1/18* (2006.01)

(52) U.S. Cl. .................. 427/58; 427/430.1; 427/437; 205/125; 205/291

(58) Field of Classification Search .............. 427/58; 205/291, 125
See application file for complete search history.

(56) References Cited

U.S. PATENT DOCUMENTS

| | | | |
|---|---|---|---|
| 3,960,676 A | 6/1976 | Miyosawa et al. | |
| 5,120,578 A | 6/1992 | Chen et al. | |
| 5,235,139 A | 8/1993 | Bengston et al. | |
| 5,705,230 A | 1/1998 | Matanabe et al. | |
| 5,843,538 A | 12/1998 | Ehrsam et al. | |
| 5,935,640 A | 8/1999 | Ferrier et al. | |
| 6,063,172 A | 5/2000 | Bokisa et al. | |
| 6,159,853 A * | 12/2000 | Lai | 438/676 |
| 6,319,543 B1 | 11/2001 | Soutar et al. | |
| 6,579,576 B1 | 6/2003 | Miller et al. | |
| 6,656,370 B1 | 12/2003 | Toscano et al. | |
| 6,726,631 B2 | 4/2004 | Hatangadi et al. | |
| 6,746,590 B2 | 6/2004 | Zhang et al. | |
| 6,773,757 B1 * | 8/2004 | Redline et al. | 427/404 |
| 6,815,126 B2 | 11/2004 | Fey et al. | |
| 2002/0047186 A1 | 4/2002 | Tellkamp | |
| 2003/0022477 A1 | 1/2003 | Hsieh et al. | |
| 2004/0043159 A1 * | 3/2004 | Rzeznik et al. | 427/430.1 |
| 2005/0173151 A1 | 8/2005 | Shepherd et al. | |

OTHER PUBLICATIONS

Menini, R.; Fournier, J.; "Use of ultrasonic agitation for copper electroplating: Application to high aspect ratio blind via interconnections"; Sep. 27, 2002; pp. 1-19.*

Use of Ultrasonic Agitation for Copper Electroplating: Application To High Aspect Ratio Blind Via Interconnections (Menini et al.) Sep. 27, 2002 entire document.

Adhesion Characteristics of Underfill Resins with Flip Chip Package Components, Man-Lung Sham et al, J. Adhesion Sci. Technol., vol. 17, No. 14, pp. 1923-1944 (2003).

Effects of Mechanical Stress and Moisture on Packaging Interfaces, Buchwalter et al, IBM Journal of Research and Development, Published online Aug. 31, 2005.

* cited by examiner

*Primary Examiner*—Vickie Kim
*Assistant Examiner*—Robert S Walters, Jr.
(74) *Attorney, Agent, or Firm*—Carmody & Torrance LLP

(57) ABSTRACT

A method of reducing solder mask interface attack in a process of fabricating printed circuit boards. The method comprises the steps of providing a printed circuit board with a solder mask applied thereon and treating the printed circuit board with an immersion plating solution, wherein the immersion plating solution is plated onto the printed circuit board with the use of ultrasonics in the plating bath. It has been found that the use of ultrasonics at a frequency of about 40 kHz for the entire plating duration provides beneficial results.

6 Claims, 4 Drawing Sheets

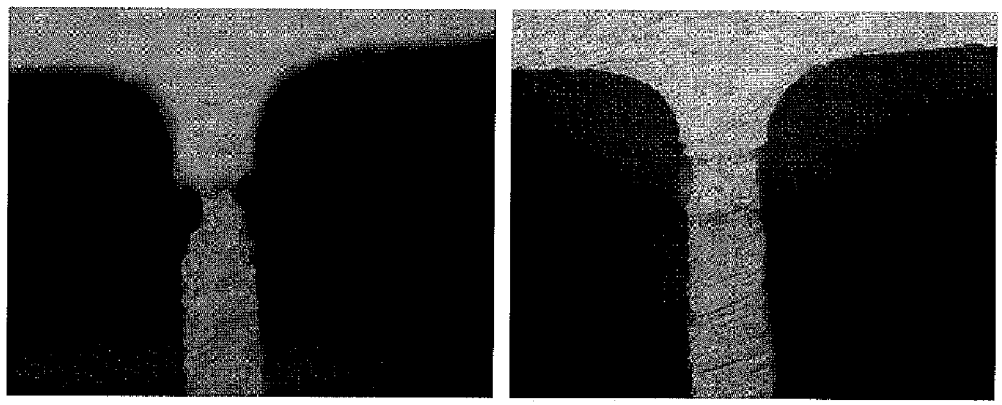
FIG. 1A - Table 1, Label C-1  FIG. 1B - Table 1, Label 40-1

FIG. 2A - Table 1, Label C-1
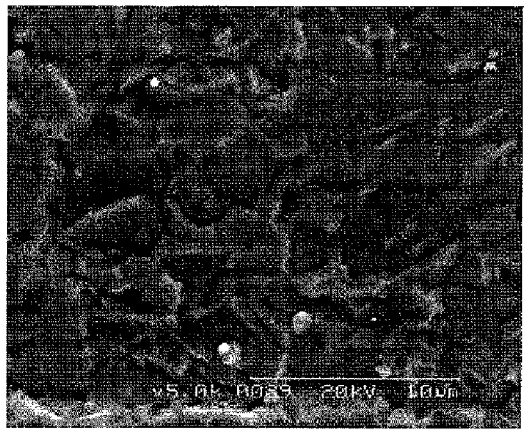
FIG. 2B - Table 1, Label 40-1
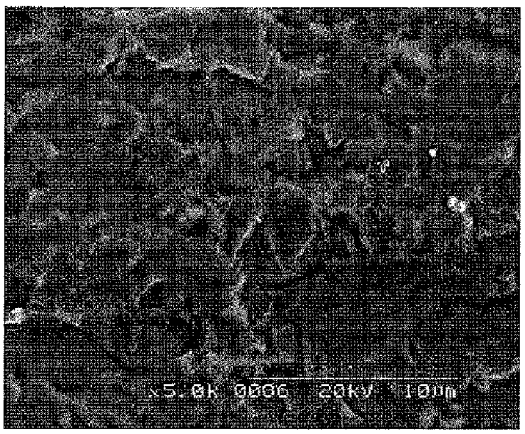
FIG. 2C - Table 1, Label 170-1

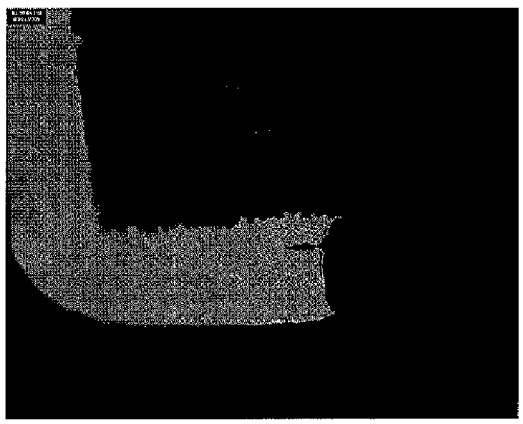 
FIG. 3A - Table 1, Label C-1    FIG. 3B - Table 1, Label 40-1

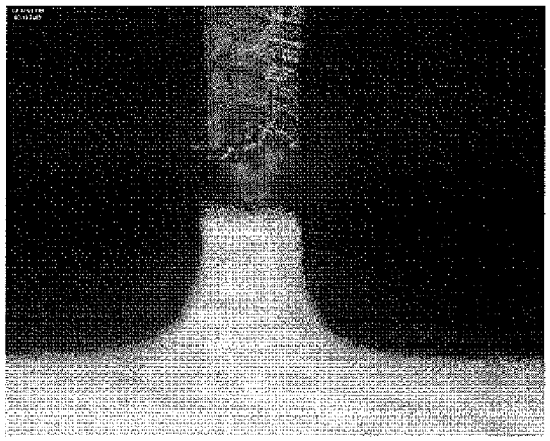
FIG. 4A - Table 1, Label C-1
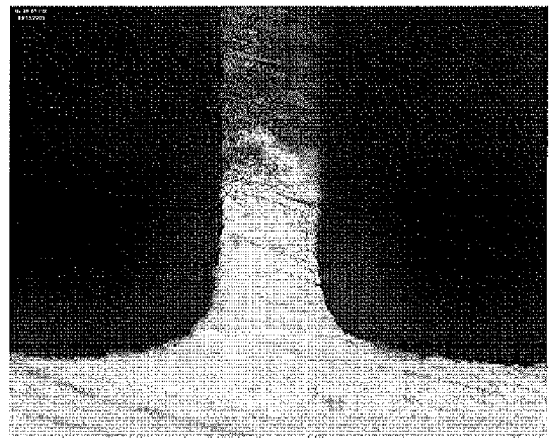
FIG. 4B - Table 3, Label 2
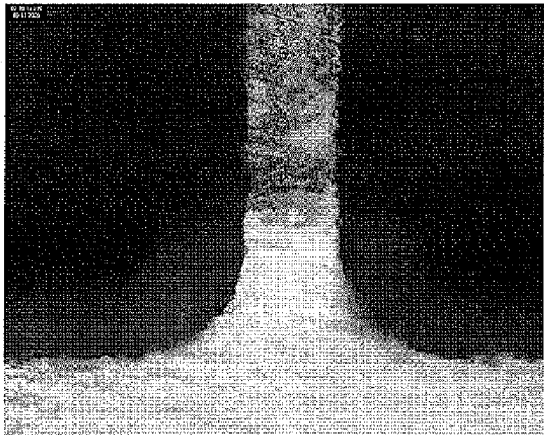
FIG. 4C - Table 3, Label 4
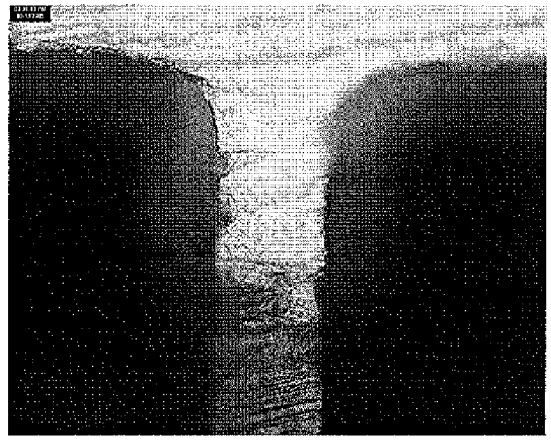
FIG. 4D - Table 3, Label 5

METHOD OF USING ULTRASONICS TO PLATE SILVER

FIELD OF THE INVENTION

The invention relates to the use of ultrasonics in immersion plating, particularly plating silver via immersion plating techniques as a final finish in circuit board processing. More specifically, the use of ultrasound is aimed at reducing excessive galvanic corrosion at the interface of the solder mask and copper circuit traces during the immersion silver plating process.

BACKGROUND OF THE INVENTION

Printed circuit board (PCB) manufacturing processes typically comprise many steps, in part because of the increasing demand for enhanced performance. Surface circuits on PCBs usually include copper and copper alloy materials that are coated to provide good mechanical and electrical connection with other devices in the assembly. In the production of a printed circuit board, a first stage comprises preparing the circuit board and the second stage comprises mounting various components on the circuit board.

There are generally two types of components that are attachable to the circuit board: a) legged components, such as resistors, transistors, etc., which are attached to the circuit board by passing each of the legs through a hole in the board and then ensuring that the hole around the leg is filled with solder; and b) surface mount devices, which are attached to the surface of the board by soldering with a flat contact area or by adhesion using an adhesive.

Plated through hole printed circuit boards may be fabricated by a process comprising the following sequence of steps, although other sequences of steps may also be used. Fresh water rinses may be interposed between each step.
1) Drill holes through copper clad laminate;
2) Process boards through standard plated through hole cycle to plate electroless copper in the holes and on the surface;
3) Apply a plating mask;
4) Electrolytically plate copper to desired thickness in the holes and on the exposed circuitry;
5) Electrolytically plate tin in holes and on exposed circuitry to serve as an etch resist;
6) Strip the plating resist;
7) Etch the exposed copper (i.e., copper not plated with tin);
8) Strip the tin;
9) Apply, image and develop a soldermask such that the soldermask covers the substantially entire board surface except for the areas of connection;
10) Protective layer; and
11) Clean and microetch the Areas of Connection.

Other examples of sequences of steps that may be used to prepare the printed circuit boards in the first stage are described in U.S. Pat. No. 6,319,543 to Soutar et al., U.S. Pat. No. 6,656,370 to Toscano et al., and U.S. Pat. No. 6,815,126 to Fey et al., the subject matter of each of which is herein incorporated by reference in its entirety.

Solder masking is an operation in which the entire area of a printed circuit board, except solder pads, surface mount pads, and printed through-holes, is selectively covered with an organic polymer coating. The polymer coating acts like a dam around the pads to prevent the undesirable flow of solder during assembly and also improves the electrical insulation resistance between conductors and provides protection from the environment.

The solder mask compound is typically an epoxy resin that is compatible with the substrate. The solder mask may be screen printed onto the printed circuit board in the desired pattern or may also be a dry film photoimageable solder mask that is coated onto the surface. Both types of solder masks are generally well known to those skilled in the art.

The contact areas include wire-bonding areas, chip attach areas, soldering areas and other contact areas. For example, contact finishes must provide good solderability, good wire bonding performance and high corrosion resistance. Some contact finishes must also provide high conductivity, high wear resistance, and high corrosion resistances. One typical prior art contact finish coating may include an electrolytic nickel coating with an electrolytic gold layer on top, although other coatings are also known to those skilled in the art.

Soldering is generally used for making mechanical, electromechanical, or electronic connections to a variety of articles. In the manufacture of electronic equipment utilizing printed circuits, connections of electronic components to the printed circuits are made by soldering of the leads of the components to the through-holes, surrounding pads, lands and other points of connection (collectively, "Areas of Connection"). Typically the connection occurs by wave soldering techniques.

To facilitate this soldering operation, the printed circuit fabricator is required to arrange that the through-holes, pads, lands and other points of connection are receptive to the subsequent soldering processes. Thus these surfaces must be readily wettable by the solder and permit an integral conductive connection with the leads or surfaces of the electronic components. Because of these needs, printed circuit fabricators have devised various methods of preserving and enhancing the solderability of surfaces. Examples of such methods are described in U.S. Pat. No. 6,773,757 to Redline et al. and in U.S. Pat. No. 5,955,640 to Ferrier et al., the subject matter of each of which is herein incorporated by reference in its entirety.

As discussed in the U.S. Pat. Nos. 6,773,757 and the 5,955,640 (incorporated herein by reference), it is known that immersion silver deposits provide excellent solderability preservatives, which are particularly useful in the fabrication of printed circuit boards. Immersion plating is a process which results from a replacement reaction whereby the surface being plated dissolves into solution and at the same time the metal being plated deposits from the plating solution onto the surface. The immersion plating initiates without prior activation of the surfaces. The metal to be plated is generally more noble than the surface metal. Thus immersion plating is usually significantly easier to control and significantly more cost effective than electroless plating, which requires sophisticated auto catalytic plating solutions and processes for activation of the surfaces prior to plating.

However, the use of immersion silver deposits can be problematic because of the possibility of solder mask interface attack (SMIA) wherein galvanic attack may erode the copper trace at the interface between the solder mask and the copper trace. SMIA is also known by other names such as solder mask crevice corrosion and simply galvanic attack at the solder mask interface. Regardless of the name, the problem comprises a galvanic attack at the solder mask-copper interface. Therefore, there is a need for an improved immersion plating process that can minimize or eliminate the interfacial galvanic attack. To that end, the inventors of the present invention have discovered that the use of ultrasonics in combination with an immersion plating process, particularly an immersion silver plating process, can provide a beneficial result. This interfacial galvanic attack arises as a result of the soldermask-copper interfacial structure and the immersion plating mechanism.

Ultrasonics have been used in cleaning printed circuit boards prior to plating. Ultrasonics have also been used to aid in filling microvias and blind microvias. For example, U.S. Pat. No. 5,705,230 to Matanabe et al., the subject matter of which is herein incorporated by reference in its entirety, describes a method for filling small holes or covering small recesses in the surfaces of substrates, wherein during deposition, a controlled varying voltage and/or an energy such as low frequency, high frequency or ultrasonic vibrations is applied to the substrate in order to improve the efficiency of the plated deposit. Likewise, U.S. Pat. No. 6,746,590 to Zhang et al., the subject matter of which is herein incorporated by reference in its entirety, describes the use of ultrasonic energy to enhance plating processes. However, ultrasonics have not been used in combination with immersion plating processes in the manner described herein.

BRIEF DESCRIPTION OF THE FIGURES

FIGS. 1A and 1B depict scanning electron microscope (SEM) photographs pictures of the solder mask interface under conditions of C-1 (control, no ultrasonics), corresponding to Table 1, Label C-1 and 40-1 (40 kHz, 90 seconds plating time), corresponding to Table 1, Label 40-1, respectively.

FIGS. 2A, 2B and 2C depict SEM photographs of silver surfaces from coupons plated under the conditions of C-1 (control, no ultrasonics, 90 seconds plating time) corresponding to Table 1, Label C-1, 40-1 (40 kHz, 90 seconds plating time) corresponding to Table 1, Label 40-1, and 170-1 (170 kHz, 90 seconds plating time) corresponding to Table 1, Label 170-1, respectively.

FIGS. 3A and 3B depict SEM pictures of the coupons under conditions of C-1 (control, no ultrasonics, 90 seconds plating time), corresponding to Table 1, Label C-1, and 40-1 (40 kHz, 90 seconds plating time), corresponding to Table 1, 40-1, respectively.

FIGS. 4A, 4B, 4C and 4D depict silver delivery to the solder mask interface under various conditions, corresponding to Table 1, Label C-1: Table 3, Label 2: Table 3, Label 4 and Table 3, Label 5, respectively.

SUMMARY OF THE INVENTION

It is an object of the present invention to eliminate or substantially minimize the effects of solder mask interface attack during a process for fabricating printed circuit boards.

It is another object of the present invention to investigate the use of ultrasonics in immersion plating, particularly immersion silver plating, to provide a silver deposit that does not exhibit SMIA.

To that end, the present invention is directed to a method of reducing solder mask interface attack in a process of fabricating printed circuit boards comprising the steps of:

a) providing a printed circuit board with a solder mask applied thereon;

b) treating the printed circuit board with an immersion plating solution, wherein the printed circuit board is treated by immersing the printed circuit board in an immersion plating bath, while simultaneously applying ultrasonic vibrations to the printed circuit board.

DETAILED DESCRIPTION OF THE PREFERRED EMBODIMENTS

The inventors have found that an immersion plating process, particularly an immersion silver plating process, can be enhanced by the use of ultrasonics during plating, which minimizes or eliminates SMIA and produces a better immersion plating deposit.

The present invention is directed to a method of reducing solder mask interface attack in a process of fabricating printed circuit boards comprising the steps of:

a) providing a printed circuit board with a solder mask applied thereon;

b) treating the printed circuit board with an immersion plating solution, wherein the printed circuit board is treated by immersing the printed circuit board in an immersion plating bath, while simultaneously applying ultrasonic vibrations to the printed circuit board, such that solder mask interface attack is reduced when compared with the same process practiced without ultrasonic vibrations. Immersion silver plating is especially preferred.

The ultrasonic vibrations are preferably applied at a frequency of less than about 80kHz, more preferably between about 40 and 80 kHz, most preferably at about 40 kHz. Although the duration of the applied ultrasonic vibrations is not critical, the ultrasound is typically applied for a duration of about 60 to about 180 seconds. In a preferred embodiment, the ultrasonic vibrations are applied for the entire duration of plating.

The ultrasonic energy source is mounted in the immersion plating tank in such a way that the ultrasonic energy emitted by the ultrasonic energy source can be directed at the plating surface. The printed circuit board may also be oriented in a vertical or a horizontal direction with respect to the direction of applied ultrasonic vibrations. In one embodiment, the printed circuit board is oriented in a horizontal direction with respect to the direction of the applied ultrasonic vibrations. Application of vibrations to the printed circuit boards during plating may be performed using any apparatus generally known in the art. For example, as described in U.S. Pat. No. 6,746,590 to Zhang et al., the ultrasonic energy source may be provided in the form of a single elongated transducer or it may be provided as an array of transducers mounted along an axis.

A number of suitable immersion silver plating compositions can be utilized which typically comprise:

a) a soluble source of silver ions,
b) an acid and/or buffering agent,
c) a complexing (chelating) agent,
d) a grain refiner,
e) a tarnish inhibitor,
f) a surfactant.

It should be understood that many variations of this general formula exist. Their common feature is that they all plate silver deposits by immersion plating mechanism, that is by galvanic displacement of copper by silver as opposed to electrolytic (driven by applied electric current) and electroless in which a reducing agent is used. The use of ultrasound in this invention applies specifically to immersion processes.

The soluble source of silver ions can be derived from a variety of silver compounds, although silver nitrate is preferred. Although a variety of acids are suitable for use in this formulation, methane sulfonic acid is most preferred. The inclusion of an imidazole or an imidazole derivative has a significant positive impact upon the plate produced by immersion silver plating solutions. The inclusion of an imidazole as described above brightens the plated deposit and improves the integrity and physical properties of the resultant plated deposit. In addition, the imidazole also extends the useful life of the immersion plating solution. Histidine is an example of a particularly preferred imidazole. The plating solution may, optionally, but preferably, also contain a nitro aromatic compounds, most preferably dinito compounds, such as 3,5 dinitrohydroxybenzoic acid.

The immersion silver solution can be used in the processes of the current invention at temperatures ranging from room temperature to 200° F. but is preferably used at from 80 to 120° F. The time for immersion in the plating solution can range from about 60 to about 180 seconds.

EXAMPLES

In order to demonstrate the beneficial performance of ultrasonics on immersion silver plating deposits, a series of tests was conducted to study the effect of ultrasonics on immersion silver deposits during plating onto contact areas on the surfaces of printed circuit boards.

An ultrasonic tank of approximately 15 liter capacity was used with a 1 L beaker with a standard silver plating solution (2% acid) at 50°C. One suitable solution for use in the present invention is STERLING® Silver Plating System, available from MacDermid, Inc.

The beaker was placed on a 2-inch high support. The coupons used, were moved by hand in the solution during plating and the solution was not stirred. The power supply used offered different ultrasonic frequencies, and 40, 80, 120, and 170 kHz frequencies were used. Power modulation and frequency sweep at high and low rate and varied width were also investigated.

Example 1

Test Probing the Effect of Ultrasonics at Different Frequencies

In order to evaluate the feasibility of using ultrasonics in silver plating baths, a series of samples was conducted to evaluate interfacial galvanic attack by varying the ultrasonic frequency from a control (no ultrasonics used) to a high of 170 kHz for a time period of 90 seconds or 180 seconds. The results are presented in Table 1.

TABLE 1

Effect of ultrasonic frequency on interfacial galvanic attack

| Label | Ultrasonic Frequency | Time (sec.) | Thickness (μin) | SMIA[1] | Comments |
|---|---|---|---|---|---|
| C-1 | Not used | 90 | 10.2 | 4 | Control |
| C-2 | Not used | 180 | 24.3 | 4+ | Control |
| 40-1 | 40 kHz | 90 | 14.0 | 2 | Significantly better than control |
| 40-2 | 40 kHz | 180 | 28.2 | 2-3 | Significantly better than control |
| 80-1 | 80 kHz | 90 | 12.8 | 2-4 | Somewhat better than control |
| 80-2 | 80 kHz | 180 | 26.0 | 2-3 | Somewhat better than control |
| 120-1 | 120 kHz | 90 | 11.7 | 4 | Similar to the control |
| 120-2 | 120 kHz | 180 | 24.6 | 3-4+ | Similar to the control |
| 170-1 | 170 kHz | 90 | 11.9 | 4+ | Worse than the control |
| 170-2 | 170 kHz | 180 | 24.9 | 4-5 | Worse than the control |

[1]SMIA rating: 1 - no SMIA
2 - some attack but acceptable level
3 - unacceptable level of attack
4 - very severe attack
5 - open As seen in Table 1, ultrasound applied at approximately 40 kHz demonstrated a significant effect at reducing interfacial galvanic attack. The effect is less at higher frequencies (about 80 kHz) and even reversed at the highest ultrasound frequency (about 170 kHz).

FIGS. 1A and 1B depict scanning electron microscope (SEM) pictures of the solder mask interface under conditions of C-1 (control, no ultrasonics) and 40-1 (40 kHz, 90 seconds plating time). As can be seen, the use of ultrasonics at about 40 kHz for the duration of plating produced an improved result.

FIGS. 2A, 2B and 2C depict SEM photographs of silver surfaces from coupons plated under the conditions of C-1 (control, no ultrasonics, 90 seconds plating time), 40-1 (40 kHz, 90 seconds plating time), and 170-1 (170 kHz, 90 seconds plating time). As seen from the SEM photographs, no visible differences were noticed between the surfaces.

Next, the coupons were checked for side attack and representative photographs are provided in FIGS. 3A and 3B. FIGS. 3A and 3B depict SEM pictures of the coupons under conditions of C-1 (control, no ultrasonics, 90 seconds plating time) and 40-1 (40 kHz, 90 seconds plating time). The attack is seen for both cases, with and without ultrasonics. However, there seems to be a difference in the use of ultrasonics at about 40 kHz, in that the attack is narrower, instead of being shorter and broader as is seen with the control.

Example 2

Variation of Applied Ultrasound Direction and Duration

The second series of tests was used to determine whether: (a) the PC panel orientation, parallel or perpendicular with respect to the ultrasound direction, is important for the effect; and (b) the time of ultrasound application, 25% or 100% of plating duration, plays a role. All pieces were plated at about 40 kHz frequency. The results are presented in Table 2.

TABLE 2

Effect of direction and duration of ultrasound on interfacial galvanic attack

| Label | Coupon position | Time (sec.)[2] | Thickness (μin) | SMIA | Comments[1] |
|---|---|---|---|---|---|
| cv | vertical | 0/60 | 6.9 | 4 | Control for vertical |
| cv | vertical | 0/60 | 7.0 | 4 | Control for vertical |
| 15v | vertical | 15/60 | 7.4 | 3-4 | Slightly better than control |
| 15v | vertical | 15/60 | 6.3 | 3-4 | Slightly better than control |
| 60v | vertical | 60/60 | 8.1 | 2 | Significantly better than control |
| 60v | vertical | 60/60 | 7.5 | 2 | Significantly better than control |
| ch | horizontal | 0/60 | 3.8 | 4 | Control for horizontal |
| ch | horizontal | 0/60 | 3.7 | 4 | Control for horizontal |
| 15h | horizontal | 15/60 | 5.2 | 3 | Slightly better than control |
| 15h | horizontal | 15/60 | 4.7 | 3-4 | Slightly better than control |
| 60h | horizontal | 60/60 | 6.5 | 1-2 | Significantly better than control |
| 60h | horizontal | 60/60 | 5.2 | 1-2 | Significantly better than control |

[1]Vertical is parallel to the ultrasound direction, while horizontal orientation is perpendicular to the ultrasound direction.
[2]15/60 means that the ultrasound was applied for the first 15 seconds out of the total 60 seconds of dwell time.

As seen from Table 2, the results showed that the ultrasound effects are present at both vertical and horizontal orientations and that the results are proportional to the duration of applied ultrasound.

Example 3

Variations on Power Modulation and Frequency Sweep

A third series of tests was conducted to determine the effects of power modulation and frequency sweep on interfacial galvanic attack. In these tests, an ultrasonic frequency of about 40 kHz was used and the dwell time was 2 minutes.

TABLE 3

Effect of power modulation and frequency sweep on interfacial galvanic attack

| Label | Power Modulation | Sweep Rate | Sweep Width | Thickness | SMIA |
|---|---|---|---|---|---|
| 1 | No | No | No | 21.2 | 2 |
| 2 | No | High | High | 23.6 | 2 |
| 3 | No | High | Low | 17.9 | 2 |
| 4 | No | Low | High | 20.9 | 2 |
| 5 | No | Low | Low | 19.3 | 2 |
| 6 | Yes | No | No | 18.7 | 2 |
| c | x | x | x | 12.8 | 4+ |

No specific differences were observed between the samples 1-6 and all of the samples exhibited significantly better SMIA than the control c. However, a greater rate dependence was noticed: higher rate with ultrasonics. FIGS. 4A, 4B, 4C and 4D depict the silver delivery to the solder mask interface under conditions of the control (FIG. 4A) and three of the samples (samples 2, 4, and 5), depicted in FIGS. 4B, 4C, and 4D respectively.

As can be seen from the above results, the tests showed significantly less interfacial galvanic attack with the use of ultrasonics. The magnitude of the effect also appears to be proportional to the duration of the ultrasound duration.

What is claimed is:

1. A method of reducing solder mask interface attack in a process of fabricating printed circuit boards comprising the steps of:
   a) providing a printed circuit board comprising a layer of copper or copper alloy and a layer of solder mask on said layer of copper or copper alloy such that there is an interface between said layer of copper or copper alloy and said layer of soldermask;
   b) treating the printed circuit board with an immersion plating solution, wherein the printed circuit board is treated by immersing the printed circuit board in an immersion plating solution, while simultaneously applying ultrasonic vibrations to the printed circuit board such that the amount of galvanic attack at said interface is reduced, when compared with the same process but without applying ultrasonic vibrations;
   wherein the immersion plating solution comprises a silver immersion plating solution and wherein the ultrasonic vibrations are applied at a frequency of between about 40 and 80 kHz.

2. The method according to claim 1, wherein the ultrasonic vibrations are applied at a frequency of about 40 kHz.

3. The method according to claim 1, wherein the ultrasonic vibrations are applied for a duration of about 60 to about 180 seconds.

4. The method according to claim 1, wherein the ultrasonic vibrations are applied for the entire duration of plating.

5. The method according to claim 1, wherein the printed circuit board is oriented in a vertical or a horizontal direction with respect to the direction of applied ultrasonic vibrations.

6. The method according to claim 5, wherein the printed circuit board is oriented in a horizontal direction with respect to the direction of the applied ultrasonic vibrations.

* * * * *